(12) United States Patent  (10) Patent No.: US 7,500,148 B2
Murata  (45) Date of Patent: Mar. 3, 2009

(54) TEST APPARATUS AND TESTING METHOD

(75) Inventor: Kiyoshi Murata, Tokyo (JP)

(73) Assignee: Advantest Corporation, Tokyo (JP)

( * ) Notice: Subject to any disclaimer, the term of this patent is extended or adjusted under 35 U.S.C. 154(b) by 499 days.

(21) Appl. No.: 11/180,972

(22) Filed: Jul. 13, 2005

(65) Prior Publication Data

US 2006/0190794 A1     Aug. 24, 2006

Related U.S. Application Data

(63) Continuation of application No. PCT/JP2005/012833, filed on Jul. 12, 2005.

(30) Foreign Application Priority Data

Aug. 23, 2004   (JP)   ............................. 2004-242993

(51) Int. Cl.
    *G06F 11/00*    (2006.01)
(52) U.S. Cl. ........................ 714/32; 714/742; 714/732
(58) Field of Classification Search ................ 714/32
    See application file for complete search history.

(56) References Cited

U.S. PATENT DOCUMENTS

| | | | | |
|---|---|---|---|---|
| 5,883,906 | A * | 3/1999 | Turnquist et al. | ............ 714/738 |
| 6,560,756 | B1 * | 5/2003 | Necoechea et al. | ............. 716/4 |
| 6,751,767 | B1 * | 6/2004 | Toumiya | ............ 714/738 |
| 6,845,480 | B2 * | 1/2005 | Wang | ........................ 714/741 |
| 7,213,182 | B2 * | 5/2007 | Kobayashi | ................... 714/724 |
| 7,386,777 | B2 * | 6/2008 | Volkerink et al. | ............ 714/738 |
| 2004/0205437 | A1 * | 10/2004 | Yao et al. | ...................... 714/742 |

FOREIGN PATENT DOCUMENTS

| | | |
|---|---|---|
| JP | 2-83473 | 3/1990 |
| JP | 6-230084 | 8/1994 |

OTHER PUBLICATIONS

International Search Report issued for PCT application No. PCT/JP2005/012833 mailed on Oct. 25, 2005, 2 pages.

* cited by examiner

*Primary Examiner*—Christopher S McCarthy
(74) *Attorney, Agent, or Firm*—Osha • Liang LLP

(57) ABSTRACT

There is provided a testing apparatus that tests a device under test. The testing apparatus includes: a command executing unit operable to sequentially execute commands included in a test program for the device under test every command cycle; a test pattern memory operable to store pattern length identifying information identifying a pattern length of a test pattern sequence being output during a command cycle period executing the command and the test pattern sequence, in association with each command; a test pattern memory reading unit operable to read a test pattern sequence of a length corresponding to the pattern length identifying information stored on the test pattern memory in association with one command from the test pattern memory when the one command is executed; and a test pattern outputting unit operable to output the test pattern sequence read by the test pattern memory reading unit in association with the one command to a terminal of the device under test during a command cycle period executing the one command.

10 Claims, 8 Drawing Sheets

154

| TEST PATTERN SEQUENCE OF TEST MODE | TEST PATTERN SEQUENCE OF NORMAL MODE |
|---|---|
| CODE L0 | { ...... 00001111 ......} |
| CODE L1 | { ...... 11110000 ......} |
| CODE L2 | { ...... 00111100 ......} |
| CODE L3 | { ...... 11000011 ......} |

CODE L0 = {0, 1}
CODE L1 = {1, 0}
CODE L2 = {1, 1}
CODE L3 = {0, 0}

*FIG. 5*

| # | COMMAND | PATTERN | | | | |
|---|---|---|---|---|---|---|
| | | CH1 | CH2 | CH3 | CH4 | |
| 1 | IDXI 31 | CODE L1 | CODE L2 | CODE L2 | CODE L2 | TEST MODE |
| 2 | NOP | CODE L0 | CODE L2 | CODE L2 | CODE L2 | |
| 3 | NOP | CODE L1 | CODE L2 | CODE L2 | CODE L2 | |
| 4 | IDXI 2 | CODE L0 | CODE L2 | CODE L2 | CODE L2 | |
| 5 | NOP | CODE L1 | CODE L2 | CODE L2 | CODE L2 | |
| 6 | NOP | {001...110} | {000...110} | {000...110} | {001...110} | NORMAL MODE |
| 7 | NOP | {001...110} | {011...110} | {000...110} | {011...000} | |
| 8 | NOP | {001...110} | {000...110} | {000...110} | {011...110} | |
| 9 | NOP | {001...110} | {011...110} | {000...110} | {011...000} | |
| ⋮ | ⋮ | ⋮ | ⋮ | ⋮ | ⋮ | |

*FIG. 6*

| # | COMMAND | PATTERN | | | | |
|---|---------|---------|---|---|---|---|
|   |         | CH1 | CH2 | CH3 | CH4 | |
| 1 | NOP | {111...000} | {...011110...} | {...011110...} | {...011110...} | ⎫ |
| 2 | NOP | {000...111} | {...011110...} | {...011110...} | {...011110...} | ⎬ TEST MODE |
| 3 | NOP | {111...000} | {...011110...} | {...011110...} | {...011110...} | |
| 4 | NOP | {000...111} | {...011110...} | {...011110...} | {...011110...} | ⎭ |
| 5 | NOP | {001...110} | {000...110} | {000...110} | {011...110} | ⎫ |
| 6 | NOP | {001...110} | {011...110} | {000...110} | {011...000} | ⎬ NORMAL MODE |
| 7 | NOP | {001...110} | {000...110} | {000...110} | {011...110} | |
| 8 | NOP | {001...110} | {011...110} | {000...110} | {011...000} | ⎭ |
| ⋮ | ⋮ | ⋮ | ⋮ | ⋮ | ⋮ | |

*FIG. 7*

| # | COMMAND | PATTERN | | | |
|---|---|---|---|---|---|
| | | CH1 | CH2 | CH3 | CH4 |
| 1 | NOP | 0 | 1 | 1 | 0 |
| 2 | NOP | 1 | 0 | 1 | 0 |
| 3 | IDXI 100 | 1 | 1 | 1 | 0 |
| 4 | NOP | 0 | 0 | 1 | 1 |
| 5 | NOP | 0 | 1 | 0 | 1 |

FIG. 8

TEST APPARATUS AND TESTING METHOD

CROSS REFERENCE TO THE RELATED APPLICATION

The present application is a continuation application of PCT/JP2005/012833 filed on Jul. 12, 2005, which claims priority from a Japanese Patent application No. 2004-242993 filed on Aug. 23, 2004, the entire contents of which are incorporated herein by reference for all purposes.

BACKGROUND OF THE INVENTION

1. Field of the Invention

The present invention relates to a testing apparatus and a testing method for a device. More particularly, the present invention relates to a testing apparatus and a testing method compressing and memorizing a test program to be used for a test of a device.

2. Description of Related Art

A testing apparatus tests a device under test (DUT) based on a test program. The test program includes commands to be executed by the testing apparatus every command cycle and test patterns to be output to each terminal of the device under test or expectation patterns to be compared with output patterns output from each terminal of the device under test.

Conventionally, there has been used a testing apparatus that compresses the test program by means of repeated commands in order to reduce data volume of the test program. FIG. 8 shows a compression format of the conventional test program. According to the test program of FIG. 8, a NOP command (a no-operation command) is executed in a first command cycle, and each of test patterns {0, 1, 1, 0} is output to each of {terminal 1, terminal 2, terminal 3, terminal 4}.

Similarly, the NOP command is executed in a second command cycle, and each of test patterns {1, 0, 1, 0} is output to each of {terminal 1, terminal 2, terminal 3, terminal 4}. Then, an IDXI command that is a repeated command is executed in a third command cycle, and test patterns {1, 1, 1, 0} continue to be output to {terminal 1, terminal 2, terminal 3, terminal 4} during 100 cycles. In this manner, when all terminals continue to use the same patterns during a plurality of command cycles, the conventional testing apparatus reduces the size of the test program by means of repeated commands.

Now, since a related patent document is not recognized, the description is omitted.

Meanwhile, with speedup of an electronic device of recent years, transmission speed of signals input to and output from the electronic device has exponentially become high. Such an electronic device inputs data of a plurality of bits and outputs data of a plurality of bits during one cycle.

On the other hand, an electronic device of recent years is designed to previously carry a test function of the electronic device in order to improve the efficiency of a test. Such a design is referred to as DFT (Design for Testability), and is indispensable to a high level of electronic device of recent years. For example, a certain electronic device has a circuit that sets an initial state for a test in a register in the electronic device.

The test for such an electronic device has a test mode to perform an initial setup and a normal mode to input a pattern sequence to the electronic device after the initial setup. In other words, the testing apparatus firstly holds a pattern sequence for the initial setup in a register in the electronic device, and then inputs the pattern sequence for a test to an input terminal of the electronic device. In such a test, while the normal mode requires inputting a number of patterns during one command cycle, the test mode requires inputting one pattern during one command cycle.

Therefore, a utilization ratio of a memory is bad when a plurality of bits used in the normal mode is stored in association with each of all commands. On the other hand, when an operating frequency of the testing apparatus is changed according to an operation mode in order to change the length of bit stream output per unit time, the design of the testing apparatus becomes complicated. The object of the present invention is to reduce capacity of a memory storing a pattern sequence without complicating the design of the testing apparatus.

SUMMARY OF THE INVENTION

Therefore, it is an object of the present invention to provide a testing apparatus and a testing method for a device that can solve the foregoing problems. The above and other objects can be achieved by combinations described in the independent claims. The dependent claims define further advantageous and exemplary combinations of the present invention.

To achieve this object, according to the first aspect of the present invention, there is provided a testing apparatus that tests a device under test. The testing apparatus includes: a command executing unit operable to sequentially execute commands included in a test program for the device under test every command cycle; a test pattern memory operable to store pattern length identifying information identifying a pattern length of a test pattern sequence being output during a command cycle period executing the command and the test pattern sequence, in association with each command; a test pattern memory reading unit operable to read a test pattern sequence of a length corresponding to the pattern length identifying information stored on the test pattern memory in association with one command from the test pattern memory when the one command is executed; and a test pattern outputting unit operable to output the test pattern sequence read by the test pattern memory reading unit in association with the one command to a terminal of the device under test during a command cycle period executing the one command.

Moreover, the testing apparatus may test the device under test by either of a slow mode having a short pattern sequence to be output when executing one command or a fast mode having a long pattern sequence in comparison to the slow mode, the test pattern memory may store operation mode instructing information showing which one of the slow mode and the fast mode operates the testing apparatus during a cycle period executing the command as the pattern length identifying information in association with each command, and the test pattern outputting unit may sequentially output each pattern of the test pattern sequence read by the test pattern memory reading unit to the terminal of the device under test according to a speed corresponding to the operation mode instructing information.

Moreover, the testing apparatus may further include a slow mode format controlling unit operable to memorize a test pattern sequence of the fast mode outputting a pattern waveform identical with a test pattern sequence of the slow mode in association with each test pattern sequence of the slow mode, and the test pattern outputting unit may output the test pattern sequence of the fast mode memorized by the slow mode format controlling unit in association with the test pattern sequence of the slow mode to the terminal of the device under test when the test pattern sequence of the slow mode has been read corresponding to the one command.

Moreover, the testing apparatus may further include a hold point register operable to set a hold point showing a retention period holding the last logical value in a cycle just before outputting the test pattern sequence in the slow mode when the test pattern sequence is output in the slow mode, and the slow mode format controlling unit may output the last logical value in the cycle just before the output for the retention period and start outputting the test pattern sequence read by the test pattern memory reading unit after a lapse of the retention period.

Moreover, the slow mode format controlling unit may memorize either of a data 0 pattern sequence outputting a logical value zero after outputting a logical value one for a predetermined period, a data 1 pattern sequence outputting the logical value one after outputting the logical value zero for the predetermined period, a negative pulse outputting the logical value zero for the predetermined period and again outputting the logical value one after outputting the logical value one for the predetermined period, or a positive pulse outputting the logical value one for the predetermined period and again outputting the logical value zero after outputting the logical value zero for the predetermined period.

Moreover, the test pattern memory may store the test pattern sequence of the slow mode or the test pattern sequence of the fast mode that is output during a command cycle period executing the command in association with each command, the slow mode format controlling unit may convert the test pattern sequence of the slow mode read by the test pattern memory reading unit into the test pattern sequence of the fast mode outputting the pattern waveform designated by the test pattern sequence of the slow mode, the testing apparatus may further include a test pattern sequence selecting unit operable to select the test pattern sequence read by the test pattern memory reading unit or the test pattern sequence converted by the slow mode format controlling unit based on the pattern length identifying information corresponding to the read test pattern sequence, and the test pattern outputting unit may serially output the test pattern sequence selected by the test pattern sequence selecting unit to the terminal of the device under test.

Moreover, the test pattern outputting unit may output the test pattern sequence of the slow mode to a scan input terminal of the device under test in advance of a test of the device under test in order to initialize the device under test in the test, and output the test pattern sequence of the fast mode in order to test the device under test.

According to the second aspect of the present invention, there is provided a testing apparatus that tests a device under test. The testing apparatus includes: a command executing unit operable to sequentially execute commands included in a test program for the device under test every command cycle; an expectation pattern memory operable to store an expectation pattern sequence to be sequentially compared with a plurality of output patterns sequentially output from a terminal of the device under test during a command cycle period executing the command and pattern length identifying information identifying a pattern length of the expectation pattern sequence, in association with each command; an expectation pattern memory reading unit operable to read an expectation pattern sequence of a length corresponding to the pattern length identifying information stored on the expectation pattern memory in association with one command from the expectation pattern memory when the one command is executed; and an expectation comparing unit operable to compare the expectation pattern sequence read by the expectation pattern memory reading unit in association with the one command and an output pattern sequence consisting of the plurality of output patterns output from the terminal of the device under test, during a command cycle period executing the one command.

According to the third aspect of the present invention, there is provided a testing method testing a device under test. The testing method includes: a command executing step of sequentially executing commands included in a test program for the device under test every command cycle; a step of storing pattern length identifying information identifying a pattern length of a test pattern sequence being output during a command cycle period executing the command and the test pattern sequence on a test pattern memory, in association with each command; a test pattern memory reading step of reading a test pattern sequence of a length corresponding to the pattern length identifying information stored on the test pattern memory in association with one command from the test pattern memory when the one command is executed; and a test pattern outputting step of outputting the test pattern sequence read in the test pattern memory reading step in association with the one command to a terminal of the device under test during a command cycle period executing the one command.

According to the fourth aspect of the present invention, there is provided a testing method testing a device under test. The testing method includes: a command executing step of sequentially executing commands included in a test program for the device under test every command cycle; a step of storing an expectation pattern sequence to be sequentially compared with a plurality of output patterns sequentially output from a terminal of the device under test during a command cycle period executing the command and pattern length identifying information identifying a pattern length of the expectation pattern sequence on an expectation pattern memory, in association with each command; an expectation pattern memory reading step of reading an expectation pattern sequence of a length corresponding to the pattern length identifying information stored on the expectation pattern memory in association with one command from the expectation pattern memory when the one command is executed; and an expectation comparing step of comparing the expectation pattern sequence read in the expectation pattern memory reading step in association with the one command and an output pattern sequence consisting of the plurality of output patterns output from the terminal of the device under test, during a command cycle period executing the one command.

The summary of the invention does not necessarily describe all necessary features of the present invention. The present invention may also be a sub-combination of the features described above.

According to the present invention, a memory region storing a test pattern can be utilized effectively.

BRIEF DESCRIPTION OF THE DRAWINGS

FIG. 5 is a view showing a data structure on a default pattern memory according to an embodiment of the present invention.

FIG. 6 is a view exemplary showing a test program according to an embodiment of the present invention.

FIG. 7 is a view showing another example of the test program.

FIG. 8 is a view showing a compression format of the conventional test program.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
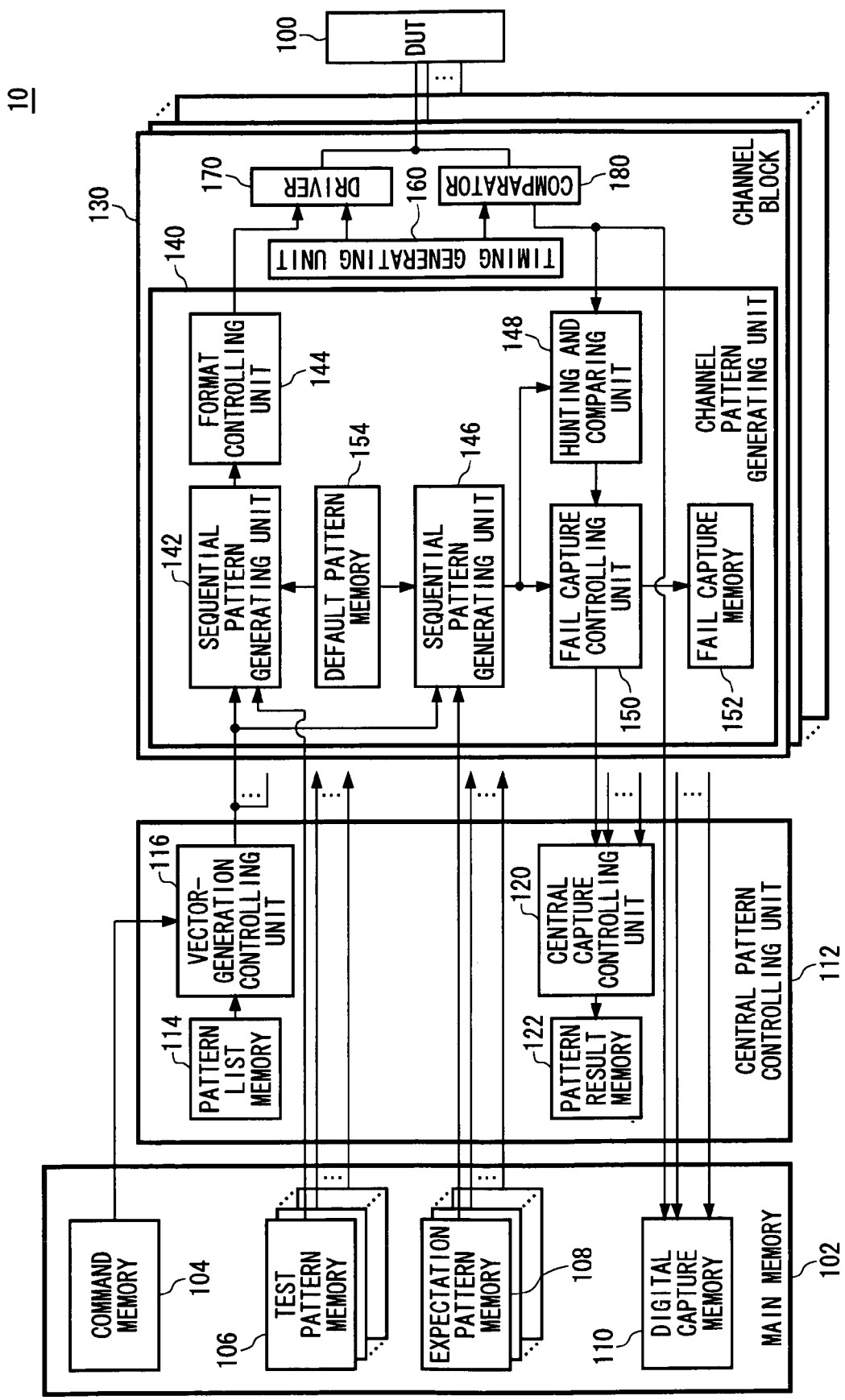
FIG. 1 is a view showing a configuration of a testing apparatus according to an embodiment of the present invention.

FIG. 1 shows a configuration of a testing apparatus 10 according to an embodiment of the present invention. The testing apparatus 10 is a testing apparatus that tests a DUT 100 including one or a plurality of terminals, and includes a main memory 102, a central pattern controlling unit 112, and a plurality of channel blocks 130.

The main memory 102 stores a test program for the DUT 100, and records an output pattern output from the DUT 100 by executing the test program. The main memory 102 has a command memory 104, a plurality of test pattern memories 106, a plurality of expectation pattern memories 108, and a digital capture memory 110.

The command memory 104 stores each command included in the test program. Each of the plurality of test pattern memories 106 is provided corresponding to each terminal of the DUT 100, and stores a test pattern sequence being used during a command cycle period carrying out the command for each terminal in association with each command.

Here, the test pattern sequence includes a plurality of test patterns to be sequentially output to the terminals of the DUT 100 during a command cycle period. For example, when the testing device 10 outputs a 32-bit signal per one command cycle to the DUT 100, the test pattern memory 106 stores the test pattern sequence made up of 32 test patterns corresponding to the 32-bit signal output during one command cycle period in association with each command.

In addition, the testing apparatus 10 has two operation modes such as a test mode and a normal mode. The test mode is an example of a slow mode according to the present invention, and when executing one command in the test mode, a pattern sequence output by the execution is shorter than that of the normal mode. Moreover, the normal mode is an example of a fast mode according to the present invention, and a pattern sequence of the normal mode is longer that that of the test mode.

In other words, the test pattern memory 106 may store a test pattern sequence having a pattern length different from the other commands in association with any command. For this reason, the test pattern memory 106 further stores pattern length identifying information identifying a pattern length of the test pattern sequence output during a command cycle period executing the command in association with each command, in association with the test pattern sequence.

Each of the plurality of expectation pattern memories 108 is provided corresponding to each terminal of the DUT 100, and stores an expectation pattern sequence being used during a command cycle period carrying out the command in association with each command, in association with the pattern length identifying information identifying the pattern length of the test pattern sequence. Here, the expectation pattern sequence includes a plurality of expectation patterns to be sequentially compared with a plurality of output patterns sequentially output from the terminals of the DUT 100 during a command cycle period. The digital capture memory 110 records the output patterns output from the DUT 100 by executing the program.

As described above, the command memory 104, the plurality of test pattern memories 106, the plurality of expectation pattern memories 108, and/or the digital capture memory 110 may respectively be divided and provided in separate memory modules composing the main memory 102, or may respectively be provided in different memory areas in the same memory module.

The central pattern controlling unit 112 is connected to the main memory 102 and the plurality of channel blocks 130, and performs a process common to each terminal of the DUT 100. The central pattern controlling unit 112 has a pattern list memory 114, a vector-generation controlling unit 116, a central capture controlling unit 120, and a pattern result memory 122.

The pattern list memory 114 stores start/termination addresses of a routine in the command memory 104, a start address of the test pattern in the test pattern memory 106, a start address of the expectation pattern in the expectation pattern memory 108, or the like in regard to each of a main routine and each subroutine of the test program. The vector-generation controlling unit 116 is an example of a command executing unit according to the present invention, and sequentially executes the commands included in the test program for the DUT 100 every command cycle. More specifically, the vector-generation controlling unit 116 sequentially reads the commands from the start address to the termination address from the pattern list memory 114 for each routine in order to sequentially execute them.

The central capture controlling unit 120 receives a decision result for each terminal of the DUT 100 from each of the channel block 130, and totals the decision results of the DUT 100 for each routine. The pattern result memory 122 stores the decision results of the DUT 100 for each routine.

Each of the plurality of channel blocks 130 is provided corresponding to each of the terminals of the DUT 100. Each channel block 130 has a channel pattern generating unit 140, a timing generating unit 160, a driver 170, and a comparator 180.

The channel pattern generating unit 140 generates a test pattern sequence or an expectation pattern sequence to be used for a test of the terminal, and compares an output pattern sequence from the DUT 100 and the expectation pattern sequence. The channel pattern generating unit 140 includes a default pattern memory 154, a sequential pattern generating unit 142, a format controlling unit 144, a sequential pattern generating unit 146, a hunting and comparing unit 148, a fail capture controlling unit 150, and a fail capture memory 152.

The default pattern memory 154 stores the pattern sequence of the normal mode outputting a pattern waveform identical with the pattern sequence of the test mode in association with each test pattern sequence and each expectation pattern sequence (here in after, referred to as a pattern sequence) of the test mode.

The sequential pattern generating unit 142 receives a start address of the test pattern sequence to be output corresponding to an execution routine from the vector-generation controlling unit 116. Then, the sequential pattern generating unit 142 sequentially reads the test pattern sequence from the start address from the test pattern memory 106 corresponding to each command cycle in order to sequentially output them to the format controlling unit 144. The format controlling unit 144 functions as a test pattern outputting unit according to the present invention along with the driver 170, and converts the test pattern sequence into a format to control the driver 170.

The sequential pattern generating unit 146 receives a start address of the expectation pattern sequence from the vector-generation controlling unit 116 in response to an execution routine. Then, the sequential pattern generating unit 146 sequentially reads the expectation patterns from the start address from the expectation pattern memory 108 in response to each command cycle, in order to sequentially outputs them to the hunting and comparing unit 148 and the fail capture controlling unit 150. The hunting and comparing unit 148 is an example of an expectation comparing unit according to the present invention, and inputs the output pattern sequence output from the DUT 100 via the comparator 180 to compare it with the expectation pattern sequence. Here, the hunting and comparing unit 148 may have a hunting function in which the output pattern sequence having the indefinite timing output from the DUT 100 is compared with the expectation pattern sequence on condition that the specific header pattern sequence is output from the DUT 100.

The fail capture controlling unit 150 receives match/mismatch information of the output pattern sequence from the DUT 100 and the expectation pattern sequence from the hunting and comparing unit 148, to generate the decision result of the good or bad for the terminal of the DUT 100. The fail capture memory 152 stores fail information including the result of a hunting process by the hunting and comparing unit 148, the output pattern value that is not identical with the expected value, and so on.

The timing generating unit 160 generates the timing in which the driver 170 outputs each test pattern included in the test pattern sequence and the timing in which the comparator 180 acquires the output patterns from the DUT 100. The driver 170 functions as a test pattern outputting unit according to the present invention along with the format controlling unit 144, and outputs each test pattern output by the format controlling unit 144 in the channel pattern generating unit 140 to the DUT 100 in the timing designated by the timing generating unit 160. As a result, the driver 170 sequentially outputs each pattern of the test pattern sequence to the terminal of the DUT 100 by a speed according to the test mode or the normal mode.

The comparator 180 acquires the output pattern output from the terminal of the DUT 100 and supplies it to the hunting and comparing unit 148 in the channel block 130 and the digital capture memory 110, in the timing designated by the timing generating unit 160.

In addition, the channel pattern generating unit 140 may have a configuration including a common sequential pattern generating unit having the functions of the sequential pattern generating unit 142 and the sequential pattern generating unit 146, in place of a configuration separately having the sequential pattern generating unit 142 and the sequential pattern generating unit 146 described above.

Figure 2:
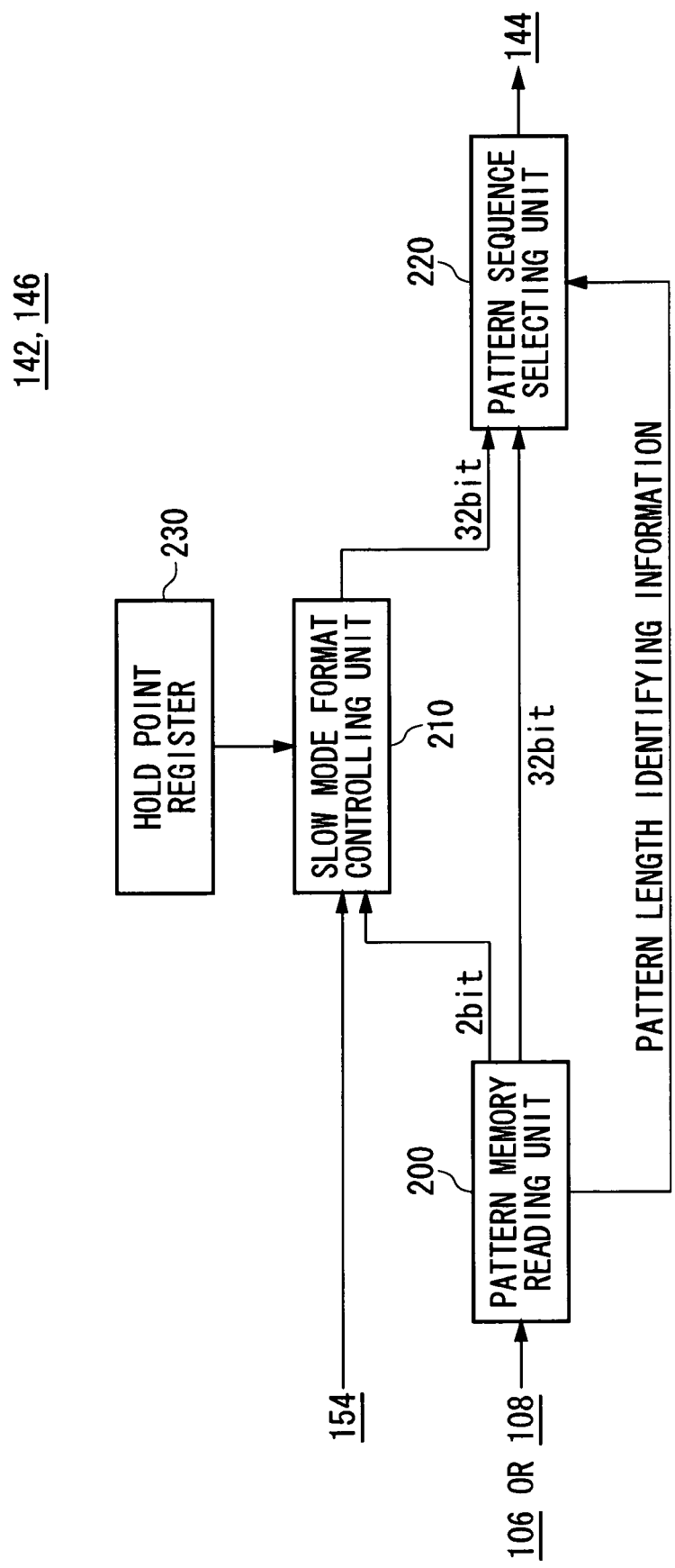
FIG. 2 is a view showing a configuration of a sequential pattern generating unit 142 and a sequential pattern generating unit 146 according to an embodiment of the present invention.

FIG. 2 shows a configuration of the sequential pattern generating unit 142 and the sequential pattern generating unit 146 according to an embodiment of the present invention. The sequential pattern generating unit 142 has a pattern memory reading unit 200 that is an example of a test pattern memory reading unit according to the present invention, a slow mode format controlling unit 210, a pattern sequence selecting unit 220, and a hold point register 230. When one command is executed, the pattern memory reading unit 200 reads a test pattern sequence stored on the test pattern memory 106 in association with the one command from the test pattern memory 106. Moreover, the pattern memory reading unit 200 reads pattern length identifying information identifying a pattern length of the test pattern sequence from the test pattern memory 106.

The slow mode format controlling unit 210 memorizes a pattern sequence (e.g., a pattern sequence of 32 bits) of the normal mode outputting a pattern waveform identical with a pattern sequence of the test mode in the default pattern memory 154, in association with each pattern sequence (e.g., a pattern sequence of 2 bits) of the test mode. Then, the slow mode format controlling unit 210 converts the pattern sequence of the test mode read by the pattern memory reading unit 200 into the pattern sequence of the normal mode outputting the pattern waveform designated by the pattern sequence, by means of the default pattern memory 154.

The pattern sequence selecting unit 220 selects the pattern sequence read by the pattern memory reading unit 200 or the pattern sequence converted by the slow mode format controlling unit 210 based on the pattern length identifying information corresponding to the read pattern sequence, and outputs the selected sequence to the format controlling unit 144. The driver 170 receives this, and operates along with the format controlling unit 144 and inputs the pattern sequence selected by the pattern sequence selecting unit 220 to the device under test 100.

When the pattern sequence of the test mode is output, the hold point register 230 sets a hold point showing a retention period holding the last logical value in a cycle just before outputting the pattern sequence. In other words, the slow mode format controlling unit 210 outputs the last logical value in a cycle just before the output until the retention period elapses, and starts outputting the pattern sequence read by the pattern memory reading unit 200 after the retention period elapses.

As the sequential pattern generating unit 146 has substantially the same structure as the sequential pattern generating unit 142, the description is omitted here except the difference as described below. The pattern memory reading unit 200 provided in the sequential pattern generating unit 146 is an example of the expectation pattern memory reading unit according to the present invention. In case where the testing device 10 executes one command, the pattern memory reading unit 200 reads out the expectation pattern sequence having a length corresponding to the pattern length identification information stored in expectation pattern memories 108, while correlating with the command. The slow mode format controlling unit 210 converts the pattern sequence of the test mode into a pattern sequence of the normal mode corresponding to the pattern sequence of the test mode, if the pattern memory reading unit 200 reads out the pattern sequence of the test mode similar to the slow mode format controlling unit 210 provided in the sequential pattern generating unit 142.

The pattern sequence selecting unit 220 selects the expectation pattern sequence read by the pattern memory reading unit 200 from the expectation pattern memory 108 in response to one command or the expectation pattern sequence converted by the slow mode format controlling unit 210 during a command cycle period executing the one command similarly to the pattern sequence selecting unit 220 in the sequential pattern generating unit 142, and output the selected sequence to the format controlling unit 144. The hunting and comparing unit 148 that is an example of an expectation comparing unit according to the present invention receives this, and compares the expectation pattern sequence selected by the pattern sequence selecting unit 220 and an output pattern sequence consisting of a plurality of output patterns output from the terminal of the DUT 100.

Figure 3:
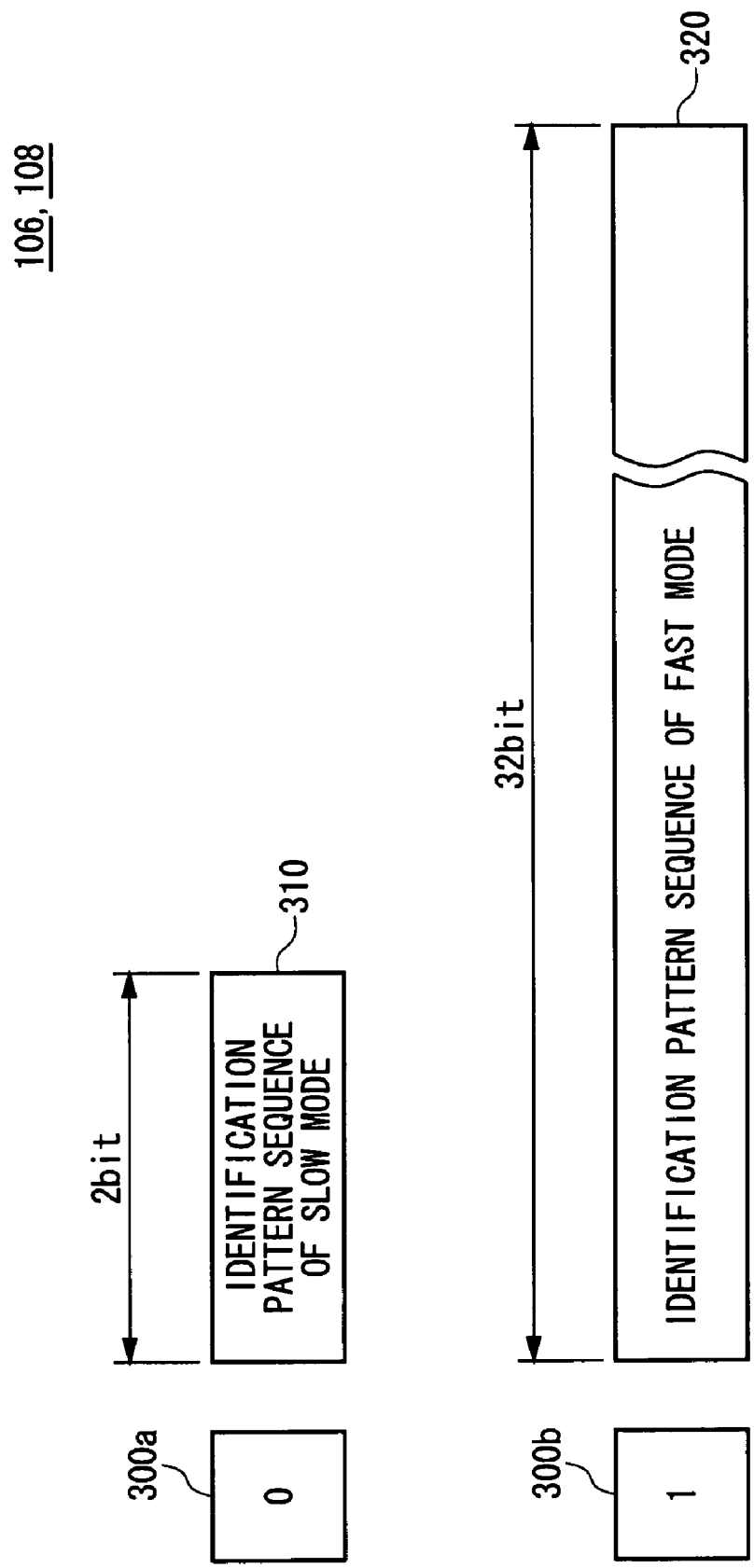
FIG. 3 is a view exemplary showing a test pattern sequence stored on a test pattern memory and an expectation pattern memory according to an embodiment of the present invention.

FIG. 3 shows an example of the test pattern sequence stored on the test pattern memory 106 and the expectation pattern memory 108 according to an embodiment of the present invention. Referring to FIG. 3, an example of the pattern length identifying information will be described. In the description of the present drawing, the test pattern memory 106 and the expectation pattern memory 108 are referred to as "a pattern memory". The pattern memory stores pattern length identifying information 300 identifying a pattern length of a pattern sequence and the pattern sequence.

For example, the pattern memory stores pattern length identifying information 300a showing that the pattern length of the pattern sequence is two bits, in association with a pattern sequence 310 of the test mode. On the other hand, the pattern memory stores pattern length identifying information 300b showing that the pattern length of the pattern sequence is 32 bits, in association with a pattern sequence 320 of the normal mode.

When the pattern memory reading unit 200 reads the pattern length identifying information 300a, the driver 170 outputs two-bit pattern during a cycle period executing the corresponding command. In this case, the testing apparatus 10 operates in the test mode. On the other hand, when the pattern memory reading unit 200 reads the pattern length identifying information 300b, the driver 170 outputs 32-bit pattern during a cycle period executing the corresponding command. In this case, the testing apparatus 10 operates in the normal mode. In this manner, the pattern length identifying information acts as operation mode instructing information showing which one of the test mode and the normal mode operates the testing apparatus 10 during a cycle period executing the command, in association with each command.

Figure 4:
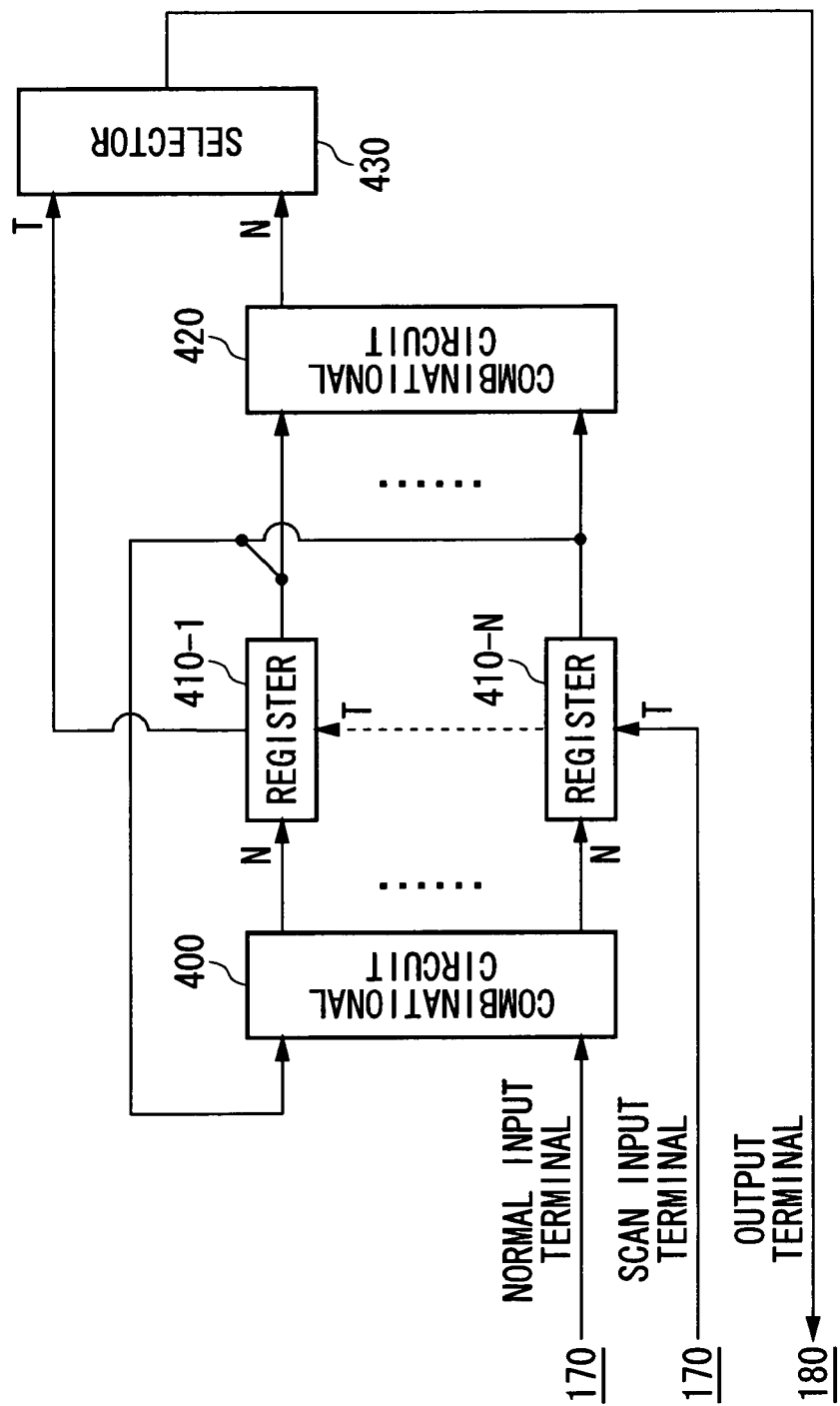
FIG. 4 is a view showing a configuration of a device under test according to an embodiment of the present invention.

FIG. 4 shows a configuration of the device under test 100 according to an embodiment of the present invention. The device under test 100 has a combinational circuit 400, registers 410-1 to 410-N, a combinational circuit 420, and a selector 430. The combinational circuit 400 sequentially inputs the test patterns from the driver 170 via the normal input terminal, and changes values held in the registers 410-1 to 410-N. The registers 410-1 to 410-N changes the values according to the input from the combinational circuit 400. The combinational circuit 420 sends a signal based on the values held in the registers 410-1 to 410-N to the selector 430.

Here, the combinational circuit 400 is a comparatively complicated logic circuit. For this reason, in order to set a desired value in the registers 410-1 to 410-N by means of the combinational circuit 400, it is necessary to have comparatively deep logic depth in many cases. For this reason, setting an initial condition of a test requires much more time. Thus, the device under test 100 has a scan input terminal for setting a value in the registers 410-1 to 410-N. In this way, the registers 410-1 to 410-N can sequentially input an arbitrary test pattern from the driver 170 to hold the test pattern.

Similarly, since the combinational circuit 420 is a comparatively complicated logic circuit, outputting the values held in the registers 410-1 to 410-N to the device under test 100 requires much more time. Thus, the selector 430 selects the value of the registers 410-1 to 410-N or the output of the combinational circuit 420 to output it to the outside. In this way, it is possible to easily output the values held in the registers 410-1 to 410-N according to, e.g., the result of the test.

FIG. 5 shows a data structure of the default pattern memory 154 according to an embodiment of the present invention. The slow mode format controlling unit 210 memorizes a test pattern sequence of the normal mode outputting a pattern waveform identical with a pattern sequence of the test mode in the default pattern memory 154 in association with each pattern sequence of the test mode. For example, the slow mode format controlling unit 210 stores a data 1 pattern sequence outputting a logical value one after outputting a logical value zero for a predetermined period in the normal mode, in association with the pattern sequence (CODE L0) of the test mode showing a logical value one.

Moreover, the slow mode format controlling unit 210 stores a data 0 pattern sequence outputting a logical value zero after outputting a logical value one for a predetermined period, in the normal mode, in association with the pattern sequence (CODE L1) of the test mode showing a logical value zero. Further, the slow mode format controlling unit 210 stores a pattern sequence of a positive pulse outputting a logical value one for a predetermined period and then outputting a logical value zero again after outputting a logical value zero for a predetermined period, in the normal mode, in association with the pattern sequence (CODE L2) of the test mode showing a positive pulse.

Moreover, the slow mode format controlling unit 210 stores a pattern sequence of a negative pulse outputting a logical value zero for a predetermined period and then outputting a logical value one again after outputting a logical value one for a predetermined period, in the normal mode, in association with the pattern sequence (CODE L3) of the test mode showing a negative pulse. In addition, the pattern sequence of the slow mode is, e.g., 2 bits, and the CODE L0, L1, L2, and L3 respectively show {0, 1}, {1, 0}, {1, 1}, and {0, 0}.

FIG. 6 shows an example of the test program according to an embodiment of the present invention. The test program shown in FIG. 6 includes a plurality of commands to be sequentially executed and a test pattern sequence output to the DUT 100 during a command cycle period executing a command in association with each command and each terminal (CH1 to CH4). The command memory 104 stores each command shown in FIG. 6. Moreover, each of the plurality of test pattern memories 106 stores a test pattern sequence of the test mode or a test pattern sequence of the normal mode, which is output during a command cycle period executing the command in association with each command.

For example, in association with a command "IDXI 31" on a first line, the test pattern memory 106 of the terminal CH1 stores the test pattern sequence (CODE L1) of the test mode. On the other hand, in association with a command "NOP" on a sixth line, the test pattern memory 106 of the terminal CH1 stores {001 . . . 110} as a test pattern sequence of the normal mode. More specifically, the test pattern memory 106 may store these test pattern sequences, in association with operation mode instructing information showing which one of the test mode and the normal mode is applied to the test pattern sequence.

In addition, the command "IDXI 31" is a command showing that the command is executed repeatedly. For this reason, the command on the first line is repeatedly executed 31 times, and thus the test pattern sequence of the test mode is repeatedly output 31 times.

According to the storage format of the test program described above, since either storing a test pattern sequence of the test mode or storing a test pattern sequence of the normal mode can independently be determined every command in association with the same terminal, it is possible to efficiently reduce an amount of data of the test program.

More specifically, the first test pattern memory 106 corresponding to the first terminal of the DUT 100 may store a test pattern sequence of the test mode in association with the command on the first line, or may store a test pattern sequence of the normal mode in association with the command on the sixth line. In this case, the first pattern memory reading unit 200 corresponding to the first terminal reads the pattern length identifying information and the test pattern sequence stored on the first test pattern memory 106 in association with the command, during a cycle period executing the command on the first line. This pattern length identifying information shows a pattern length of the test mode.

For this reason, the slow mode format controlling unit 210 converts a test pattern sequence of the test mode into a test pattern sequence of the normal mode outputting a pattern waveform designated by the test pattern sequence of the test mode. The pattern sequence selecting unit 220 selects the test pattern sequence converted by the slow mode format controlling unit 210 based on the pattern length identifying information. The driver 170 receives this, and serially outputs the selected test pattern sequence to the device under test 100.

On the other hand, the first pattern memory reading unit 200 corresponding to the first terminal reads the pattern length identifying information and the test pattern sequence stored on the first test pattern memory 106 in association with the command, during a cycle period executing the command on the ninth line. This pattern length identifying information shows a pattern length of the normal mode. For this reason, the pattern sequence selecting unit 220 selects the test pattern sequence read by the pattern memory reading unit 200 based on the pattern length identifying information. The driver 170 receives this, and serially outputs the test pattern sequence to the device under test 100.

According to the testing device 10 described above, a test pattern sequence of the test mode or a test pattern sequence of the normal mode can independently stored on the test pattern memory 106 every command in association with the same terminal. As a result, for example, the driver 170 can output a test pattern sequence of the test mode to the scan input terminal of the device under test 100 in advance of a test of the device under test 100, in order to initialize the device under test 100 in the test. On the other hand, the driver 170 can output a test pattern sequence of the normal mode to the device under test 100, in order to test the test device under test 100 with a high-speed operating frequency according to performance of the device under test 100. In this way, since a pattern sequence of a format suitable for an operation mode of the device under test 100 can be stored on the test pattern memory 106, the test program can be compressed effectively while holding an operating frequency required for the test.

In addition, it has been described about a case when a test pattern sequence is stored on the test pattern memory 106 in FIG. 6. However, since storing an expectation pattern sequence on the expectation pattern memory 108 is similar to the above description, its description will be omitted.

FIG. 7 shows another example of the test program. According to the present drawing, as with FIG. 6, the test program includes a plurality of commands to be sequentially executed and a test pattern sequence output to the DUT 100 during a command cycle period executing a command in association with each command and each terminal (CH1 to CH4). The command memory 104 stores each command shown in FIG. 7. However, unlike FIG. 6, each of the plurality of test pattern memories 106 stores the only 32-bit test pattern sequence being output during a command cycle period executing a command in association with each command.

For example, in association with a command "NOP" on a first line, the test pattern memory 106 of the terminal CH1 stores {000 . . . 001} as a test pattern sequence of the slow mode. Moreover, in association with a command "NOP" on a sixth line, the test pattern memory 106 of the terminal CH1 stores {001 . . . 110} as a test pattern sequence of the normal mode.

According to the storage format of the test program described above, the test pattern memory 106 stores a 32-bit pattern sequence per one command regardless of an operation mode of the DUT 100. In other words, although it is only necessary to input a pattern sequence of a test mode by operating the DUT 100 in the test mode, the test pattern memory 106 stores the pattern sequence of the test mode as a pattern sequence of a normal mode. As a result, memory capacity required for the test pattern memory 106 becomes larger.

Meanwhile, according to the testing apparatus 10 of the present embodiment, the test pattern memory 106 can independently store a test pattern sequence of a test mode or a test pattern sequence of a normal mode every command in association with the same terminal. As a result, since a pattern sequence of a format suitable for an operation mode of the device under test 100 can be stored, the test program can be compressed effectively while holding an operating frequency required for the test.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to effectively utilize a memory region storing test patterns.

What is claimed is:

1. A testing apparatus that tests a device under test, comprising:
    a command executing unit operable to sequentially execute commands included in a test program for the device under test every command cycle;
    a test pattern memory operable to store pattern sequence and pattern length identifying information corresponding to each of the commands, the pattern length identifying information identifying a pattern length of a test pattern sequence that is output during a command cycle period for executing each command;
    a test pattern memory reading unit operable to read a test pattern sequence having a length corresponding to the pattern length identifying information stored on said test pattern memory in association with one command from said test pattern memory when the one command is executed; and
    a test pattern outputting unit operable to output the test pattern sequence read by said test pattern memory reading unit in association with the one command to a terminal of the device under test during a command cycle period for executing the one command.

2. The testing apparatus as claimed in claim 1, wherein
    the testing apparatus tests the device under test by either slow mode having a short pattern sequence to be output when executing one command or a fast mode having a long pattern sequence in comparison to the slow mode,
    said test pattern memory stores operation mode instructing information showing which one of the slow mode and the fast mode operates the testing apparatus during a cycle period for executing the command as the pattern length identifying information corresponding to each command, and
    said test pattern outputting unit sequentially outputs each pattern of the test pattern sequence read by said test pattern memory reading unit to the terminal of the device under test according to a speed corresponding to the operation mode instructing information.

3. The testing apparatus as claimed in claim 2, further comprising:

a slow mode format controlling unit operable to memorize a test pattern sequence of the fast mode outputting a pattern waveform identical with a test pattern sequence of the slow mode in association with each test pattern sequence of the slow mode, wherein said test pattern outputting unit outputs the test pattern sequence of the fast mode memorized by said slow mode format controlling unit in association with the test pattern sequence of the slow mode to the terminal of the device under test when the test pattern sequence of the slow mode has been read corresponding to the one command.

4. The testing apparatus as claimed in claim 3, further comprising:

a hold point register operable to set a hold point showing a retention period for holding the last logical value in a cycle just before outputting the test pattern sequence in the slow mode when the test pattern sequence is output in the slow mode, wherein said slow mode format controlling unit outputs the last logical value in the cycle just before the output for the retention period and starts outputting the test pattern sequence read by said test pattern memory reading unit after a lapse of the retention period.

5. The testing apparatus as claimed in claim 3, wherein said slow mode format controlling unit memorizes either of a data 0 pattern sequence outputting a logical value zero after outputting a logical value one for a predetermined period, a data 1 pattern sequence outputting the logical value one after outputting the logical value zero for the predetermined period, a negative pulse outputting the logical value zero for the predetermined period and again outputting the logical value one after outputting the logical value one for the predetermined period, or a positive pulse outputting the logical value one for the predetermined period and again outputting the logical value zero after outputting the logical value zero for the predetermined period.

6. The testing apparatus as claimed in claim 3, wherein said test pattern memory stores the test pattern sequence of the slow mode or the test pattern sequence of the fast mode that is output during a command cycle period executing the command in association with each command, said slow mode format controlling unit converts the test pattern sequence of the slow mode read by said test pattern memory reading unit into the test pattern sequence of the fast mode outputting the pattern waveform designated by the test pattern sequence of the slow mode, the testing apparatus further comprises a test pattern sequence selecting unit operable to select the test pattern sequence read by said test pattern memory reading unit or the test pattern sequence converted by said slow mode format controlling unit based on the pattern length identifying information corresponding to the read test pattern sequence, and said test pattern outputting unit serially outputs the test pattern sequence selected by said test pattern sequence selecting unit to the terminal of the device under test.

7. The testing apparatus as claimed in claim 2, wherein said test pattern outputting unit outputs the test pattern sequence of the slow mode to a scan input terminal of the device under test in advance of a test of the device under test in order to initialize the device under test in the test, and outputs the test pattern sequence of the fast mode in order to test the device under test.

8. A testing apparatus that tests a device under test, comprising:

a command executing unit operable to sequentially execute commands included in a test program for the device under test every command cycle;

an expectation pattern memory operable to store an expectation pattern sequence and pattern length indentifying information corresponding to each of the commands, the pattern length indentifying information identifying a pattern length of the expectation pattern sequence that is to be output sequentially compared with a plurality of output patterns sequentially output from a terminal of the device under test during a command cycle period for executing each command;

an expectation pattern memory reading unit operable to read an expectation pattern sequence having a length corresponding to the pattern length identifying information stored on said expectation pattern memory in association with one command from said expectation pattern memory when the one command is executed; and an expectation comparing unit operable to compare the expectation pattern sequence read by said expectation pattern memory reading unit in association with the one command and an output pattern sequence consisting of the plurality of output patterns output from the terminal of the device under test, during a command cycle period executing the one command.

9. A testing method testing a device under test, comprising:

sequentially executing commands included in a test program for the device under test every command cycle;

storing in a pattern memory a test pattern sequence and pattern length identifying information corresponding to each of the commands, the pattern length indentifying information identifying a pattern length of the test pattern sequence that is output during a command cycle period for executing each command;

reading a test pattern sequence having a length corresponding to the pattern length identifying information stored on the test pattern memory in association with one command from the test pattern memory when the one command is executed; and outputting the test pattern sequence read in said reading in association with the one command to a terminal of the device under test during a command cycle period for executing the one command.

10. A testing method testing a device under test, comprising:

sequentially executing commands included in a test program for the device under test every command cycle;

storing an expectation pattern memory an expectation pattern sequence and pattern identifying informatin corresponding to each of the commands, the pattern length identifying information identifying a pattern length of the expectation pattern sequence that is to be sequentially compared with a plurality of output patterns sequentially output from a terminal of the device under test during a command cycle period for executing each command;

reading an expectation pattern sequence having a length corresponding to the pattern length identifying information stored on the expectation pattern memory in association with one command from the expectation pattern memory when the one command is executed; and comparing an expectation pattern sequence read in said reading in association with the one command and an output pattern sequence consisting of the plurality of output patterns output from the terminal of the device under test, during a command cycle period executing the one command.

* * * * *

UNITED STATES PATENT AND TRADEMARK OFFICE
CERTIFICATE OF CORRECTION

PATENT NO. : 7,500,148 B2
APPLICATION NO. : 11/180972
DATED : March 3, 2009
INVENTOR(S) : Kiyoshi Murata It is certified that error appears in the above-identified patent and that said Letters Patent is hereby corrected as shown below:

In the Claims:

In Claim 5, column 13, line 26, the word "of" should be deleted.

In Claim 6, column 13, line 42, before the word "executing" the word "for" is missing.

In Claim 8, column 14, line 25, before the word "executing" the word "for" is missing.

In Claim 10, column 14, line 48, after the word "storing" the word "in" is missing.

In Claim 10, column 14, line 62, the word "an" should be the word "the".

In Claim 10, column 14, line 66, before the word "executing" the word "for" is missing.

Signed and Sealed this

Twenty-first Day of April, 2009

JOHN DOLL
*Acting Director of the United States Patent and Trademark Office*